United States Patent [19]

Chao et al.

[11] Patent Number: 5,316,867
[45] Date of Patent: May 31, 1994

[54] METHOD FOR ADHERING METAL COATINGS TO THERMOPLASTIC ADDITION POLYMERS

[75] Inventors: Herbert S. Chao, Schenectady; Carol L. Fasoldt, Nassau, both of N.Y.

[73] Assignee: General Electric Company, Schenectady, N.Y.

[21] Appl. No.: 62,264

[22] Filed: May 17, 1993

[51] Int. Cl.$^5$ .............................................. B32B 15/20
[52] U.S. Cl. .................................... 428/626; 205/917; 205/928; 205/50; 205/224; 205/169; 205/167; 205/210; 427/304; 427/306
[58] Field of Search ............... 205/158, 159, 205, 183, 205/210, 224, 917, 928, 50; 427/304, 306; 428/626

[56] References Cited

U.S. PATENT DOCUMENTS 3,847,648 11/1974 Vincent et al. ............... 427/304
5,160,600 11/1992 Patel et al. .................. 205/169

*Primary Examiner*—John Niebling
*Assistant Examiner*—Edna Wong
*Attorney, Agent, or Firm*—William H. Pittman

[57] ABSTRACT

Addition polymer substrates comprising structural groups derived from olefinic nitriles and conjugated dienes, especially ABS resin substrates, are treated with aqueous tetravalent cerium in a concentration of at least about 0.1 M, preferably with a tetravalent cerium solution, to improve adhesion to metal coatings subsequently deposited non-electrolytically; for example, by electroless deposition. The metallized articles are heat treated following metal deposition. Further metal coatings may be deposited, preferably followed by further heat treatment.

20 Claims, No Drawings

METHOD FOR ADHERING METAL COATINGS TO THERMOPLASTIC ADDITION POLYMERS

This invention relates to the metallization of plastic surfaces, and more particularly to a metallization method useful with thermoplastic addition polymers.

Metallized plastics have become of interest in recent years as a replacement for metal in such articles as automobiles, enclosures for electrical appliances, microwave ovens, business machines and the like. When fabricated of plastics alone, such enclosures are inadequate to shield internal parts from external radiation sources such as electromagnetic interference, particularly radio frequency interference, and static electricity, and also to prevent escape of internally generated radiation. Such sources of interference can be blocked out by providing a metal coating on the surface of the plastic substrate, typically by electroless or electrolytic deposition. Metallization is also desirable for the formation of printed circuit boards, whereupon the entire surface or a portion thereof is metallized and is then masked and etched in areas where metal traces are not desired.

With the development of relatively mild processing methods such as laser soldering, it has become possible to fabricate articles such as printed circuit boards from plastic materials having lower degrees of heat resistance than formerly. Examples of such materials are addition polymers comprising structural units derived from olefinic nitriles and conjugated dienes. They include acrylonitrile-butadiene-styrene resins, hereinafter sometimes designated "ABS resins". Metallized ABS resins and the like are of particular use in various decorative applications.

One of the most serious problems which arise in the metallization of plastics is the lack of adhesion of the metal layer to the substrate. Various methods for improving adhesion of metal layers to the surfaces of ABS resin substrates are known.

Early methods involved treatment with chromic acid, which severely etched the resin surface and often caused a decrease in impact strength. Other effects of residual traces of chromium chemicals on a resin surface included inactivation of electroless plating catalysts; therefore, it was absolutely necessary to employ effective rinsing steps to remove all the chromium. In any event, chromic acid treatment is no longer possible because of the environmental hazards presented by the resulting sludge. Other methods, such as those described in U.S. Pat. Nos. 3,847,648 and 5,160,600, employ palladium, an expensive material, in combination with various acids or organic solvents.

Alternative adhesion promoting methods, especially those employing less expensive and environmentally safe materials which may be recycled in the same way as chromic acid, are desirable. One such method is provided by the present invention.

Accordingly, the invention is a method for metallizing a resinous substrate comprising at least one addition copolymer comprising structural groups derived from an olefinic nitrile and a conjugated diene, said method comprising the steps of:

contacting at least a portion of said surface with aqueous tetravalent cerium in a concentration of at least about 0.1 M.

non-electrolytically depositing a metal layer on said surface; and heat treating the metal-coated surface at a temperature in the range of about 50°-80° C. for at least about 10 minutes.

The plastic substrates treated according to the present invention are formed of addition polymer comprising structural units derived from an olefinic nitrile and a conjugated diene. Typical olefinic nitriles are acrylonitrile and methacrylonitrile, the former generally being preferred because of its availability and particular suitability. Suitable dienes include butadiene, isoprene, chloroprene and 1,3-hexadiene, with butadiene being preferred.

The addition copolymer usually also contains structural units derived from at least one alkenylaromatic compound such as styrene, $\alpha$-methylstyrene, 4-methylstyrene or dibromostyrene. Styrene is generally preferred. For the sake of brevity, frequent reference hereinafter will be made to acrylonitrile, styrene and butadiene as the monomers employed. However, it should be understood that other monomers within each genus defined hereinabove may be substituted therefor when appropriate.

Thus, the suitable addition polymers include the ABS resins, which are generally preferred in the present invention. The preferred ABS resins are those prepared by the grafting of styrene and acrylonitrile on a previously formed polybutadiene latex. The proportions of combined alkenylaromatic compound(s) and acrylonitrile in the ABS resin are most often about 60-90% and preferably about 70-90%.

Proportions of acrylonitrile and alkenylaromatic compound(s) taken individually are subject to wide variation, depending on the properties desired in the resinous article. Most often, the alkenylaromatic compound(s) comprises about 60-90% by weight of the mixture of the two monomers. Unless special conditions are employed, a styrene-acrylonitrile copolymer generally comprises about 75% styrene and about 25% acrylonitrile structural units irrespective of the monomer proportions in the copolymerization mixture, and those are therefore the proportions frequently employed.

The ABS resin may also contain conventional additives. When a flame retardant resin is employed, a halogenated styrene such as dibromostyrene may replace part of the styrene. Its content is typically about 30-40% by weight of the acrylonitrile-alkenylaromatic compound mixture. Flame retardancy promoters such as antimony trioxide may also be present.

Prior to the method of this invention, it is frequently preferred to clean the surface of the substrate with a conventional detergent or degreasing agent. Typical degreasing agents are halohydrocarbons, especially chlorofluorohydrocarbons such as 1,1,2,-trichlorotrifluoroethane.

An essential step in the method of the invention is contact of the resin surface, or at least the portion thereof to be metallized, with aqueous tetravalent cerium. Any compound of tetravalent cerium may be employed; examples are cerium sulfate and cerium ammonium nitrate. The latter is often preferred by reason of its availability and particular suitability.

While not mandatory, it is strongly preferred that all the cerium be in solution in the aqueous phase. This may be accomplished, even when employing a sparingly soluble tetravalent cerium compound, if an acidic aqueous solution is employed. The preferred acid is nitric acid, and its concentration should be no greater than about 8 N since acid concentrations above this level impair adhesion of the metal layer.

The concentration of tetravalent cerium in the aqueous medium is at least about 0.1 M and preferably about 0.15–0.50 M. The treatment temperature is in the range of about 40°–65° and preferably about 55°–65° C. Treatment time is not critical but is generally at least about 5 minutes; times greater than about 20 minutes are generally not necessary.

One advantage of the method of this invention is the relative ease of recycling cerium salts in the used solution. The method causes reduction of tetravalent to trivalent cerium. Reoxidation may be easily achieved, most often by electrochemical means.

Following the tetravalent cerium treatment, it is usually preferred to rinse the substrate surface with water.

After the tetravalent cerium treatment step has been performed, a metal layer is deposited non-electrolytically on the surface of the substrate. Such deposition may be by conventional methods such as electroless deposition.

The invention is particularly advantageous with electroless metal deposition. Such deposition may be by conventional methods involving art-recognized, commercially available reagents. Methods of this type generally begin with a pretreatment to aid in the absorption of the electroless deposition catalyst, typically with a reagent such as Shipley Cleaner-Conditioner 1175A which is an alkaline solution containing organic compounds. This may be followed by surface activation employing, for example, Shipley Cataprep ® 404 containing sodium bisulfate and various surfactants; and then by treatment with an acidic palladium-containing solution as catalyst, illustrated by Shipley Cataposits ® 44 which comprises tin and palladium compounds, the palladium being the principal catalytic species.

After a water rinse, the substrate may be immersed in a solution of Shipley Cuposit ® Accelerator 19, a fluoboric acid-containing formulation used to remove tin, or an equivalent thereof. It may then be further rinsed with water and treated with one or more electroless plating solutions.

Electroless plating baths are well known in the art and are generally described, for example, in Kirk-Othmer, *Encyclopedia of Chemical Technology*, Third Edition, Volume 8, the contents of which are incorporated herein by reference. The selection of a particular electroless plating bath or process is not critical to the invention. The contents of the bath and the plating parameters such as temperature, pH and immersion time will of course depend on the metal to be deposited. Suitable plating baths include Shipley Cuposit ® 250 and 251 and Enthone Enplate ® NI-426. The former two are electroless copper solutions and the latter an electroless nickel solution.

Following metallization by electroless deposition, the metal layer is heat-treated at a temperature in the range of about 50°–80° C., preferably about 70°–80° C., for a period of time sufficient to stabilize adhesion of the metal to the resin surface. Said time period is at least 10 minutes and typically from 30 minutes to about 2 hours.

At least one further metal coating, preferably of copper, may be deposited on the substrate after the initial non-electrolytic metal deposition. Deposition of said further coating may be by conventional methods including electroless and electrolytic deposition, the details of which are likewise known to those skilled in the art. Following deposition of further metal coatings, it is strongly preferred to further heat-treat the metal surface at a similar temperature, in this instance for a period from about 30 minutes to about 5 hours.

Metallized articles comprising resinous substrates as defined hereinabove which have been subjected to treatment by the above-described method are another aspect of the invention. They have substantially improved adhesion of the metal to the resin surface, in comparison with untreated substrates, as measured by two methods.

In the "peel strength" method (IPC method 2.4.8), strips of tape, 3.2 mm. wide, are used to mask portions of the metallized surface after deposition of electrolytic copper and the exposed copper is etched away with concentrated nitric acid. The substrate is rinsed thoroughly in water, after which the force required to remove one or more of the remaining copper strips by peeling it away at 90° is measured.

The "cross-hatch tape" test is adapted from ASTM procedure D3359 and is preferred for use on surfaces having only an electroless metal coating. In the adaptation, a tool is used to score the metal surface with a series of perpendicular lines to form a grid. A piece of pressure-sensitive tape ("Permacel 310" of 3M Co.) is adhered to the metal surface over the grid and is sharply removed by pulling at approximately 90°. The grid area is then visually inspected for removal of the metal layer and evaluated on a scale of 0–5, with 5 designating essentially no metal removed and 0 designating a large amount of metal removed.

The invention is illustrated by the following examples. All percentages are by weight.

EXAMPLE 1

A test strip, 2.5×15.2 cm., was prepared from a flame-retardant ABS resin comprising 16.9% acrylonitrile, 21.6% butadiene, 35.0% styrene and 26.4% dibromostyrene units, and including various additives in minor proportions and 7 parts (by weight) of antimony trioxide per 100 parts of resin. The substrate was cleaned with a commercially available detergent at 50° C., rinsed with water for 2 minutes and contacted with an aqueous solution 0.18 M in cerium ammonium nitrate and 5.2 N in nitric acid for 10 minutes at 60° C.

The test substrate was then coated with an electroless nickel layer by the following scheme of operations:
  Water rinse—2 minutes;
  Shipley Cleaner—Conditioner 1175A—5 minutes, 2.5% by volume, 75° C.;
  Water rinse—2 minutes;
  Shipley Cataprep 404—1 minute, 270 g/l;
  Shipley Cataposit 44—3 minutes, 1.5% by volume, with Cataprep 404 at 270 g/l, 44° C.;
  Water rinse—2 minutes;
  Shipley Accelerator 19—3 minutes, 16% by volume;
  Water rinse—2 minutes;
  Enthone Enplate NI-426 nickel plating solution—50 minutes, 53° C., pH 6.2;
  Water rinse—2 minutes.

The nickel-plated substrate was heat treated for 1 hour at 75° C., after which it passed the cross-hatch tape test with a rating of 5. After exposure to 100% humidity and a temperature of 65° C. for 3 days, it still had a rating of 5.

EXAMPLE 2

ABS resin test strips identical to the strip of Example 1 were treated with various aqueous tetravalent cerium-containing compositions, plated with electroless nickel and heat treated as described in that example except that the nickel plating time was 15 minutes. They were then electroplated with copper for 60 minutes in an acid bath at a current density of 0.032 A/cm.$^2$. The resulting thick copper coatings were masked with strips of tape 3.2 mm. wide and the exposed copper was etched with concentrated nitric acid. After thorough rinsing, the tape was removed and the substrates were heat-treated for 1, 2 and 3 hours at 75° C., after which peel strength was determined. The results are given in Table 1, in comparison with a control which included no tetravalent cerium treatment.

TABLE I

| Sample | Ce salt Identity* | Conc., M | HNO$_3$ conc., N | Time, min. | Peel strength, g./mm. 1 hr. | 2 hrs. | 3 hrs. |
|---|---|---|---|---|---|---|---|
| Control | — | — | — | — | <18 | <18 | <18 |
| 1 | CAN | 0.18 | 7.8 | 10 | 63 | 72 | 73 |
| 2 | CAN | 0.18 | 10.9 | 10 | 9 | 7 | 7 |
| 3 | CAN | 0.27 | 7.8 | 10 | 70 | 63 | 93 |
| 4 | CAN | 0.36 | 7.8 | 10 | 81 | 64 | 75 |
| 5 | CAN | 0.18 | 7.8 | 20 | 70 | 70 | 66 |
| 6 | CAN | 0.27 | 7.8 | 20 | 66 | 64 | 73 |
| 7 | CAN | 0.36 | 7.8 | 20 | 45 | 43 | 60 |
| 8 | CAN | 0.18 | 5.2 | 10 | 47 | 84 | 93 |
| 9 | CAN | 0.27 | 5.2 | 10 | 72 | 75 | 77 |
| 10 | CAN | 0.36 | 5.2 | 10 | 70 | 77 | 79 |
| 11 | CAN | 0.18 | 3.9 | 10 | 43 | 48 | 72 |
| 12 | CAN | 0.27 | 3.9 | 10 | 64 | 79 | 81 |
| 13 | CAN | 0.36 | 3.9 | 10 | 68 | 54 | 109 |
| 14 | CAN | 0.18 | 1.6 | 10 | 63 | 55 | 52 |
| 15 | CAN | 0.27 | 1.6 | 10 | 61 | 61 | 66 |
| 16 | CAN | 0.36 | 1.6 | 10 | 61 | 63 | 75 |
| 17 | CS | 0.30 | 5.2 | 10 | 36 | 45 | 72 |
| 18 | CAN | 0.14 | — | 10 | 60 | 47 | 57 |

*CAN—ceric ammonium nitrate;
CS—ceric sulfate.

The results in Table I show that except for Sample 2, in which the nitric acid concentration was substantially greater than 8 N, all samples demonstrated a peel strength of at least 60 g./mm. after some period of heat treatment of the electrolytically coated substrate. Even for Sample 18, in which no nitric acid was employed and as a result a portion of the cerium salt precipitated out of solution, a relatively high peel strength was noted. The control, on the other hand, demonstrated a peel strength substantially less than 20 g./mm.

EXAMPLE 3

A test substrate identical to those of Example 1 was treated with cerium ammonium nitrate and metallized by the same sequence of steps as Sample 8 of Example 1, except that the electroless nickel plating time was 20 minutes and was followed by the heat treatment step. Additional electroless layers of copper and nickel were then applied by the following sequence of operations:

Water rinse—2 minutes;
Shipley Cuposit 251 electroless copper plating solution—20 minutes, 48° C.;
Water rinse—2 minutes;
10% aqueous sulfuric acid solution—1 minute;
Water rinse—2 minutes;
0.1% palladium(II) chloride/hydrochloric acid solution—1 minute;
Water rinse—2 minutes;
Enthone Enplate NI-426 solution—10 minutes, 53° C., pH 6.2.

The resulting metallized substrate passed the cross-hatch tape test with a rating of 5 and had a surface resistivity of 0.055 ohm/sq.

EXAMPLE 4

The procedure of Example 2, and a similar procedure employing the electroless copper solution of Example 3, were employed to metallize test strips prepared from an ABS resin comprising 29% acrylonitrile, 20% butadiene and 51% styrene units. The cerium salt employed was cerium ammonium nitrate. The results are given in Table 11.

TABLE II

| Sample | Electroless metal | CAN conc., M | HNO$_3$ conc., N | Peel strength, g./mm. 1 hr. | 2 hrs. | 3 hrs. | 4 hrs. |
|---|---|---|---|---|---|---|---|
| 19 | Ni | 0.18 | 5.2 | 109 | 97 | 91 | — |
| 20 | Cu | 0.27 | 5.2 | 54 | 73 | 72 | 93 |
| 21 | Cu | 0.27 | 1.6 | 102 | 91 | 104 | 97 |

EXAMPLE 5

The procedures of Example 3 were repeated, employing an ABS resin containing 31% acrylonitrile, 12% butadiene and 57% styrene units. The results are given in Table 111.

TABLE III

| Sample | Electroless metal | CAN conc., M | HNO$_3$ conc., N | Peel strength, g./mm. 1 hr. | 2 hrs. | 3 hrs. | 4 hrs. |
|---|---|---|---|---|---|---|---|
| 22 | Ni | 0.18 | 5.2 | 102 | 104 | 95 | — |
| 23 | Cu | 0.27 | 5.2 | 73 | 77 | 81 | 81 |
| 24 | Cu | 0.27 | 1.6 | 77 | 73 | 68 | 77 |

What is claimed is:

1. A method for metallizing a resinous substrate comprising at least one addition copolymer comprising structural groups derived from an olefinic nitrile and a conjugated diene, said method comprising the steps of:
   contacting at least a portion of said surface with aqueous tetravalent cerium in a concentration of at least about 0.1 M.
   non-electrolytically depositing a metal layer on said surface; and
   heat treating the metal-coated surface at a temperature in the range of about 50°–80° C. for at least about 10 minutes.

2. A method according to claim 1 wherein all of said cerium is in solution in the aqueous phase.

3. A method according to claim 2 wherein the metal layer is deposited by electroless deposition.

4. A method according to claim 3 wherein the aqueous cerium solution also contains nitric acid in a concentration no greater than about 8 N.

5. A method according to claim 3 wherein the substrate comprises an acrylonitrile-butadiene-styrene resin.

6. A method according to claim 5 wherein the cerium concentration is about 0.15–0.50 M.

7. A method according to claim 5 wherein the cerium solution treatment temperature is in the range of about 40°–65° C.

8. A method according to claim 5 wherein the metal is nickel or copper.

9. A method according to claim 5 wherein at least one further metal coating is deposited on the substrate after the electroless metal deposition.

10. A method according to claim 9 wherein the metal-coated surface is further heat treated at a temperature in the range of about 50°–80° C. for at least about 30 minutes after the deposition of further metal coatings.

11. A method according to claim 10 wherein the further metal coating is copper.

12. A method according to claim 10 wherein the further metal coating is deposited by electroless deposition.

13. A method according to claim 10 wherein the further metal coating is deposited electrolytically.

14. An article comprising a resinous substrate which has been metallized by the method of claim 1.

15. An article comprising a resinous substrate which has been metallized by the method of claim 3.

16. An article comprising a resinous substrate which has been metallized by the method of claim 5.

17. An article comprising a resinous substrate which has been metallized by the method of claim 8.

18. An article comprising a resinous substrate which has been metallized by the method of claim 9.

19. An article comprising a resinous substrate which has been metallized by the method of claim 10.

20. An article comprising a resinous substrate which has been metallized by the method of claim 11.

* * * * *